(12) United States Patent
Barnette

(10) Patent No.: US 6,970,511 B1
(45) Date of Patent: Nov. 29, 2005

(54) INTERPOLATOR, A RESAMPLER EMPLOYING THE INTERPOLATOR AND METHOD OF INTERPOLATING A SIGNAL ASSOCIATED THEREWITH

(75) Inventor: James D. Barnette, Austin, TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 934 days.

(21) Appl. No.: 09/650,850

(22) Filed: Aug. 29, 2000

(51) Int. Cl.$^7$ ............................................. H04N 11/04
(52) U.S. Cl. ............................... 375/240.21; 708/313
(58) Field of Search ................... 708/313; 20/290, 20/313; 375/240, 240.21

(56) References Cited

U.S. PATENT DOCUMENTS

| | | | |
|---|---|---|---|
| 4,707,824 A | 11/1987 | Kanemasa | |
| 4,924,492 A | 5/1990 | Gitlin et al. | |
| 5,351,087 A | 9/1994 | Christopher et al. | |
| 5,353,279 A | 10/1994 | Koyama | |
| 5,396,517 A | 3/1995 | Yedid et al. | |
| 5,418,849 A | 5/1995 | Cannalire et al. | |
| 5,512,898 A | 4/1996 | Norsworthy et al. | |
| 5,604,769 A | 2/1997 | Wang | |
| 5,610,909 A | 3/1997 | Shaw | |
| 5,631,899 A | 5/1997 | Duttweiler | |
| 5,668,794 A | 9/1997 | McCaslin et al. | |
| 5,732,107 A * | 3/1998 | Phillips et al. | 375/296 |
| 5,748,126 A | 5/1998 | Ma et al. | |
| 5,809,033 A | 9/1998 | Turner et al. | |
| 5,841,809 A | 11/1998 | Koizumi et al. | |
| 5,926,505 A | 7/1999 | Long | |
| 5,970,137 A | 10/1999 | LeDamany et al. | |
| 6,208,671 B1 | 3/2001 | Paulos et al. | |
| 6,240,128 B1 | 5/2001 | Banerjea et al. | |
| 6,389,064 B1 | 5/2002 | Dholakia et al. | |
| 6,434,233 B1 | 8/2002 | Bjarnason et al. | |
| 6,526,139 B1 | 2/2003 | Rousell et al. | |
| 6,532,289 B1 | 3/2003 | Magid | |
| 6,573,940 B1 | 6/2003 | Yang | |
| 6,597,787 B1 | 7/2003 | Lindgren et al. | |
| 6,628,738 B1 | 9/2003 | Peeters et al. | |

OTHER PUBLICATIONS

Floyd M. Gardner "Interpolation in Digital Modems—Part I: Fundamentals" IEEE Transactoins on Communications, vol. 41, No. 3, Mar. 1993; pp. 501-507.

Lars Erup, et al. "Interpolation in Digital Modems—Part II: Implementation and Performance" IEEE Transactions on Communications, vol. 41, No. 6, Jun. 1993; pp. 998-1008.

James D. Barnette, et al.; U.S. Appl. No. 09/652,116, filed Aug. 29, 2000 entitled "Resampler for a bit Pump and Method of Resampling a Signal Associated Therewith"; pp. 1-59; 6 drawing sheets.

Mandeep Singh Chadha, et al.; U.S. Appl. No. 09/650,854, filed Aug. 29, 2000 entitled "Separation Circuit for an Echo Canceling System and Method of Operating the Same"; pp. 1-67; 6 drawing sheets.

(Continued)

*Primary Examiner*—Stephen Chin
*Assistant Examiner*—Kevin Kim

(57) ABSTRACT

An interpolator, method of interpolating a one-bit signal and resampler employing the interpolator and method. The interpolator employs a cascaded architecture to interpolate a one-bit input signal received at an input thereof. In one embodiment, the interpolator includes a multiple order interpolation filter that generates a sample range from at least three input samples associated with the one-bit input signal. The interpolator further includes a linear interpolation filter, associated with the multiple order interpolation filter, that develops a plurality of samples within the sample range.

49 Claims, 6 Drawing Sheets

OTHER PUBLICATIONS

Mandeep Singh Chadha, et al.; U.S. Appl. No. 09/650,853, filed Aug. 29, 2000 entitled "Echo Canceling System for a Bit Pump and Method of Opearting the Same"; pp. 1-60; 5 drawing sheets.

Mandeep Singh Chadha, et al.; U.S. Appl. No. 09/650,851, filed Aug. 29, 2000 entitled "Filter Circuit for a Bit Pump and Method of Configuring the Same" pp. 1-57; 7 drawing sheets.

"Multirate Systems and Filter Banks," by P. P. Vaidyanathan. Prentice Hall Signal Processing Series. Chap. 5. Section 5.3. pp. 211-213. Jul. 1992.

* cited by examiner

INTERPOLATOR, A RESAMPLER EMPLOYING THE INTERPOLATOR AND METHOD OF INTERPOLATING A SIGNAL ASSOCIATED THEREWITH

This U.S. application is related to the following U.S. applications.

| Reference Number | Serial Number | File Date | Title |
|---|---|---|---|
| Chadha 3-3-1 | 09/650,853 | Aug. 29, 2000 | ECHO CANCELING SYSTEM FOR A BIT PUMP AND METHOD OF OPERATING THE SAME |
| Chadha 2-2-2 | 09/650,854 | Aug. 29, 2000 | SEPARATION CIRCUIT FOR AN ECHO CANCELING SYSTEM AND METHOD OF OPERATING THE SAME |
| Chadha 1-1-1-1 | 09/650,851 | Aug. 29, 2000 | FILTER CIRCUIT FOR A BIT PUMP AND METHOD OF CONFIGURING THE SAME |
| Barnette 2-2 | 09/652,116 | Aug. 29, 2000 | RESAMPLER FOR A BIT PUMP AND METHOD OF RESAMPLING A SIGNAL ASSOCIATED THEREWITH |

The above-referenced U.S. applications are commonly assigned with the present invention and incorporated herein by reference.

TECHNICAL FIELD OF THE INVENTION

The present invention is directed, in general, to digital signal processing and, more specifically, to an interpolator, a resampler employing the interpolator and method of interpolating a signal associated therewith.

BACKGROUND OF THE INVENTION

The existing public switched telephone network represents a significant capital investment that has taken place in great part over the last 80 years. The public switched telephone network was originally designed for voice services (so-called plain old telephone service) and was entirely analog.

Originally, the public switched telephone network included "local loops" which connected homes and businesses to central office switches. This allowed anyone having a telephone connected to the central office switch to call one another. A given central office typically only covers a relatively small area.

To allow people to call one another from greater distances, central office switches were interconnected by analog trunks. Unfortunately, signal quality suffered greatly as distances increased. Filters and amplifiers improved quality, but only to a limited extent.

Over time, however, the analog trunks (that may be thought of as forming the "backbone" of the public switched telephone network) were replaced with land-based microwave, satellite and optical fiber links. Public switched telephone network signals ("traffic") were digitized for transmission over the backbone, significantly improving signal quality, service and reliability.

To maximize utilization of the backbone, an assumption was made that, at the time, seemed straightforward. The assumption was based on the observation that public switched telephone network traffic consisted of human speech, which by its nature occupies frequencies below 4 kilohertz (kHz).

Thus, it was decided that higher frequencies were of limited value and represented a waste of bandwidth if the traffic were to be digitized and transmitted. The higher frequencies were, as a result, discarded when signals were initially digitized. The net effect was that more conversations were carried over a given microwave, satellite or fiber link.

While truncating the frequencies above 4 kHz was of no consequence to the transmission of speech, the same proved not to be true for data. In the quest for speed, computer modems have attempted to use as much bandwidth as possible, and in the most clever manner. Unfortunately, even in view of the most clever modems, the 4 kHz digitization cutoff has imposed an apparent limit on the speed of such devices. Unfortunately, the analog local loops have unjustly taken most of the blame for the speed limitation.

Digital subscriber line (DSL), developed over the past few years, presents a novel solution to the speed limitation conundrum. According to DSL, local loops are employed to carry speech in a stream at normal frequencies (exclusively below 4 kHz). The local loops, however, are also called upon to carry data in a stream at frequencies exclusively above 4 kHz. DSL termination circuits located at the home or business and the central office combine and separate the voice and data streams as they enter and leave the local loop. Once separated at the central office, the voice stream is digitized for relay over the public switched telephone network backbone as before, and by employing the existing infrastructure. The data stream, however, is sent through the public switched telephone network or another network (such as the Internet via a different path), without imposition of the 4 kHz artificial bandwidth limits.

One form of DSL, Asymmetrical DSL (ADSL) was designed with the Internet particularly in mind and accordingly emphasizes downloading of data over uploading of data (which is the nature of Internet "surfing"). ADSL uses the frequency spectrum between 0–4 kHz for the plain old telephone service stream and 4 kHz to 2.2 MHZ for the data stream. Depending on the design, length and conditions of the local loop, ADSL can offer speeds up to 9 Mbits/s (Mbps) for downstream (network to user) and up to 800 Kbps for upstream (user to network) communication.

Another form of DSL, High-Bit Rate DSL (HDSL) is a technology extension of DSL. HDSL is a symmetric transport medium, meaning that it provides 1.544 Mbps transmission speed both downstream and upstream over distances as far as 12,000 feet, without repeaters. Because about 20% of loops are longer than 12,000 feet, the industry has developed a repeater for HDSL that effectively doubles the span's reach to 24,000 feet. HDSL is based on a technology called adaptive equalization, which digitally analyzes and then compensates for distortion, imperfections in the copper line itself as well as adverse environmental conditions, throughout the transmission process. Furthermore, HDSL transmits full-duplex signals on each pair of wire and uses echo cancellation to separate the receive signals from the transmit signals.

To enhance and build on that inherent symmetry, standards bodies are now working on HDSL's next generation, called HDSL2. HDSL2 promises full-duplex T-Carrier 1 (T1) payload over one copper loop, while still delivering the same time and cost efficiencies for T1 deployment that HDSL offers. Carriers everywhere are running out of copper in their local loop plants. One of HDSL2's key benefits will focus squarely on and alleviate that concern. Essentially, the technology will double the number of available T1 lines because it requires only a single copper pair, compared with the two pairs required by the standard HDSL. As a result, HDSL2 may replace standard HDSL for most T1 deployments in the future, although HDSL will remain an option in those cases in which there may still be some engineering reasons for deploying a two-loop solution. One example is with long loops in excess of 12,000 feet, where span-powered HDSL repeaters may still be necessary. Beyond just workhorse T1 deployment, HDSL2 also should prove to be a viable competitive technology for Internet access applications that require symmetrical data delivery.

HDSL2, therefore, further enhances the noteworthy advantages associated with DSL. First, DSL-based technology does not require local loops to be replaced. Second, DSL-based technology overcomes a the 4 kHz digitization barrier without requiring changes to existing public switched telephone network voice-handling equipment. Third, DSL-based technology requires relatively little equipment to combine and later separate speech and data streams. Fourth, DSL-based technology allows speech and data to occur simultaneously over the same local loop. HDSL2 now promises full-duplex T1 payload over one copper loop, while still delivering the same time and cost efficiencies for T1 deployment that its predecessor, HDSL, offers.

Some technical challenges, however, remain for HDSL2. One is designing a transceiver that can accommodate the full-duplex T1 payload in conjunction with the standard defined by American National Standards Institute (ANSI) committee T1E1.4 (June 1995), which is incorporated herein by reference. In conjunction therewith, resampling techniques may be employed in the receive path of the digital signal processing portion of the transceiver as a postprocessing function to the analog front-end portion of the transceiver. The resampling techniques are employed to process and reconfigure outputs from an analog-to-digital converter that is used to convert analog receive signals to a digital format. The resampling techniques typically perform an additional task of combining and aligning or synchronizing the digital format with a local oscillator.

A currently employed analog-to-digital converter is a sigma/delta modulator that typically provides a single, one-bit output data stream. The one-bit output data stream provides a representation of a positive or negative change in the analog input signal. The dynamic response, that is, the sampling rate of the sigma/delta analog-to-digital converter, should be chosen to allow accurate tracking of the analog input signal. Otherwise, its one-bit output data stream will provide a distorted representation of its analog input signal. A sigma/delta analog-to-digital converter may also be configured to provide more than one digital output data stream.

A cascaded 2-1-1 sigma/delta analog-to-digital converter provides three one-bit output data streams corresponding to a sample of an analog input signal. Currently, the three one-bit output data streams are recombined to form one, multi-bit output data stream before further processing is performed. The multi-bit output data stream is typically further processed through a digital filter requiring a multiplication involving digital filter coefficients. This multiplication process requires a true hardware multiplier to accommodate the multi-bit data stream and efficiently accomplish the task. Such hardware multipliers consume significant electrical power and require significant die area on an integrated circuit chip making such an approach problematic with a design criteria of low power and size.

When a linear interpolating resampler does not provide adequate quality, designers frequently resort to higher-order LaGrange or other polyphase low-pass filter structures to implement the resampling function. Use of a higher order LaGrange interpolator for the resampling function results in extra hardware to compute the desired filter coefficients as a function of the resampling phase. For a third order LaGrange interpolator, an additional eight non-trivial multipliers are generally employed to generate the required coefficients. Use of a polyphase low-pass filter structure typically requires a read-only memory or a random access memory for coefficient storage, which adds significant area to the hardware. Such filters also consume significant power in the multiplier.

Accordingly, what is needed in the art is a resampler that provides a way to effectively and efficiently integrate and merge the processing functions of sample interpolation and selection, which are associated with a transceiver that facilitates communication over, for instance, a network employing DSL-based technology such as HDSL2.

SUMMARY OF THE INVENTION

To address the above-discussed deficiencies of the prior art, the present invention provides an interpolator, method of interpolating a one-bit signal and resampler employing the interpolator and method. The interpolator employs a cascaded architecture to interpolate a one-bit input signal received at an input thereof. In one embodiment, the interpolator includes a multiple order interpolation filter that generates a sample range from at least three input samples associated with the one-bit input signal. The interpolator further includes a linear interpolation filter, associated with the multiple order interpolation filter, that develops a plurality of samples within the sample range.

The present invention introduces, in one aspect, an interpolator employing a multiple order interpolation filter that is integrated or merged with a linear interpolation filter. The multiple order interpolation filter, in an exemplary embodiment, is a finite impulse response filter that does not require feedback to implement. The present invention provides for efficiently implementing a resampler with higher quality than linear interpolation without adding significant additional complexity. Multiple sets of coefficients may be taken for multiple phase points of an input sample. For example, three sets of coefficients may be taken at phases representing zero, 180 and 360 degrees. Then, using a desired phase taken modulo 0.5 (180 degrees), linear interpolation between sets of first and second coefficients or sets of second and third coefficients may be accomplished. The first and second coefficient sets may be selected if a sampling phase lies between zero and 180 degrees. Otherwise, the second and third coefficient sets may be selected. In this manner, only one additional term is added to produce an interpolated output.

In an embodiment to be illustrated and described, the multiple order interpolation filter generates the sample range from four input samples associated with the one-bit input signal. In a related embodiment, the multiple order interpolation filter interpolates a range associated with the input samples by a number (e.g., two) to establish the sample range. Of course, any number of input samples associated with the one-bit input signal and interpolation factor may be employed to advantage.

In another aspect, the present invention provides a resampler for use with a bit pump (the digital signal processing portion of a transceiver employing the resampler) having a receive path couplable to an oscillator. The resampler includes an interpolation stage, coupled to an input of the resampler, that receives a one-bit input signal representing at least a portion of a receive signal propagating along the receive path. The interpolation stage includes a multiple order interpolation filter that generates an intermediate sample range from at least three input samples associated with the one-bit input signal, and a linear interpolation filter, associated with the multiple order interpolation filter, that develops a plurality of intermediate samples within the intermediate sample range. The resampler further includes a selection stage, coupled to the interpolation stage, that selects one of the plurality of intermediate samples thereby providing an output sample that corresponds to a phase of the oscillator.

In one embodiment of this aspect of the present invention, the interpolation stage receives multiple one-bit input signals representing at least a portion of the receive signal. The interpolation stage further includes a plurality of linear interpolation filters that develop a plurality of intermediate samples from at least two input samples associated with ones of the multiple one-bit input signals.

In a related embodiment of this aspect of the present invention, the selection stage selects corresponding ones of the plurality of intermediate samples from the at least two input samples associated with ones of the multiple one-bit input signals thereby providing output samples that correspond to the phase of the oscillator. Thus, the resampler employs a configuration that employs a multiple order/linear section in conjunction with at least one linear interpolation filter section to produce multiple output samples. Thus, the principles of the present invention are equally applicable to resampling circumstances employing multiple one-bit input signals.

In a related, but alternative embodiment of this aspect of the present invention, the resampler further includes a combining stage that combines the output samples. The resultant resampled output signal then represents a single sample from an analog-to-digital converter, coupled to the receive path of the bit pump, that has been synchronized to the appropriate sample phase of the oscillator. Additionally, the combining stage may alter the representation of the single sample to include multiple bit formats.

In one embodiment of this aspect of the present invention, the resampler further includes a filter stage that filters the output samples. In a related, but alternative embodiment, the filter stage includes one of a second and third order section. Of course, any filter configuration is well within the broad scope of the present invention.

In one embodiment of this aspect of the present invention, the resampler further includes a delay stage. As stated above, the resampler may accommodate multiple input signals and may contain multiple delay stages in the form of a delay line. The delay stage or multiple delay stages provide access to a collection of signal samples that may provide appropriate filtering or other interpolation functions.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
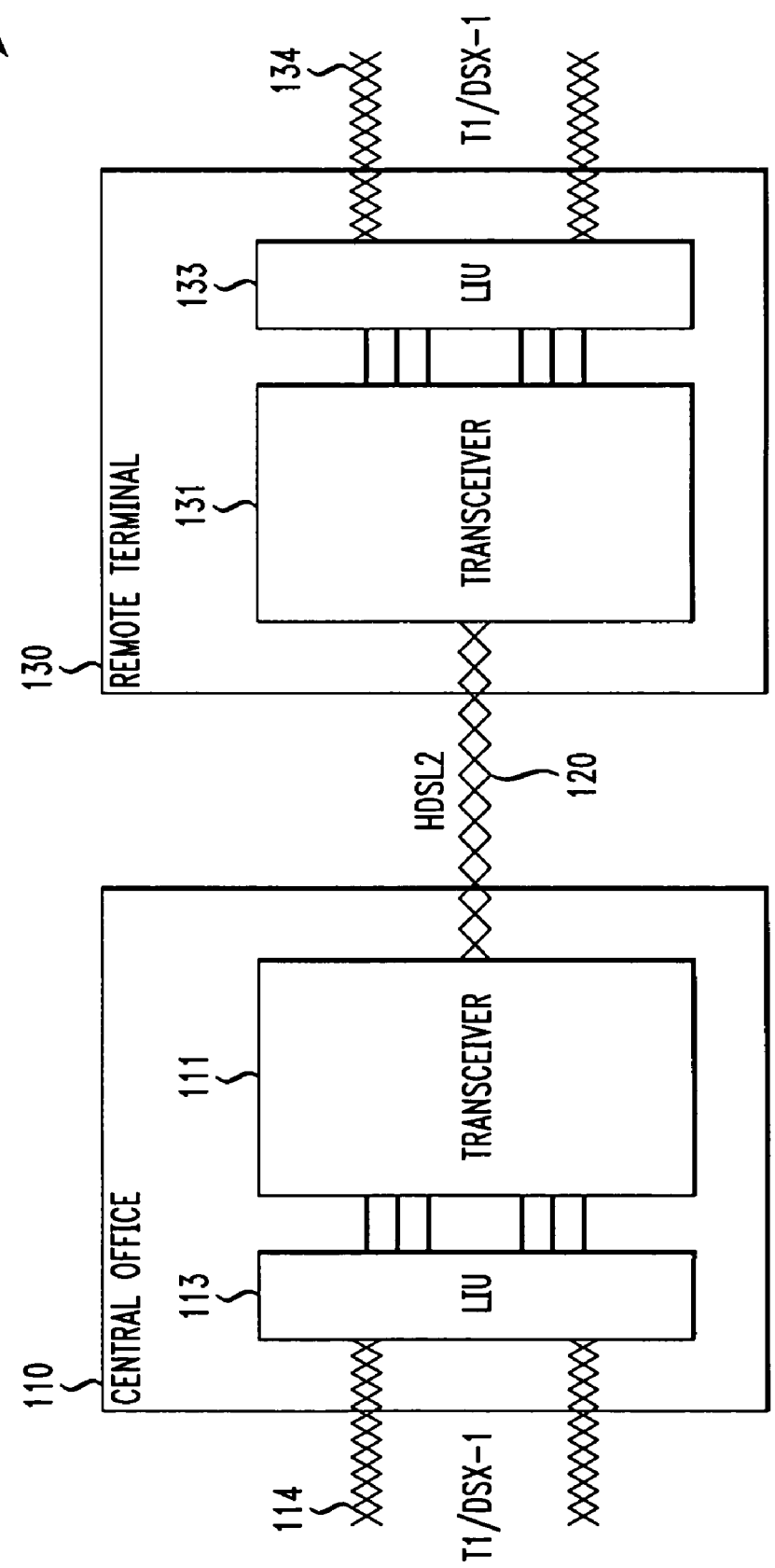
FIG. 1 illustrates a system level diagram of an embodiment of a communications network within which an embodiment of a transceiver constructed according to the principles of the present invention may operate.

Referring initially to FIG. 1, illustrated is a system level diagram of an embodiment of a communications network, generally designated 100, within which an embodiment of a transceiver constructed according to the principles of the present invention may operate. The communications network 100 may form a portion of a larger communications network (e.g., the public switched telephone network) and may advantageously provide high-bit-rate digital subscriber line service over a single twisted pair wire (commonly referred to as HDSL2). The communications network 100 includes a central office 110 and a remote terminal 130. The central office 110 embodies any conventional or later developed switching system that facilitates communications over the communications network 100. The remote terminal 130 embodies any conventional or later developed communications device (e.g., a multimedia personal computer) adapted to communicate with the communications network 100. It should be understood that the central office 110 may be advantageously coupled to a plurality of remote terminals 130.

The central office 110 is coupled via one or more central office trunks (one of which is designated 114) to the public switched telephone network. The central office trunks 114 are designated as either T1 long haul or DSX-1 short haul trunks for illustrative purposes only. The central office trunks 114 are coupled via a cental office line interface unit 113 to a central office transceiver 111.

The remote terminal 130 is coupled via one or more remote terminal trunks (one of which is designated 134) to the public switched telephone network. The remote terminal trunks 134 are also designated as either T1 long haul or DSX-1 short haul trunks for illustrative purposes only. The remote terminal trunks 134 are coupled via a remote terminal line interface unit 133 to a remote terminal transceiver 131.

The cental office 110 is coupled to the remote terminal 130 via a single twisted pair wire (or single copper loop) 120 adapted to carry the high-bit-rate digital subscriber line service. The central office and remote terminal transceivers 110, 130 provide the requisite signal processing and other core functions to support the high-bit-rate digital subscriber line service. Those skilled in the art should understand that the communications network 100 is submitted for illustrative purposes only and other network configurations (including communications networks compatible with digital subscriber line service) are well within the broad scope of the present invention.

Figure 2:
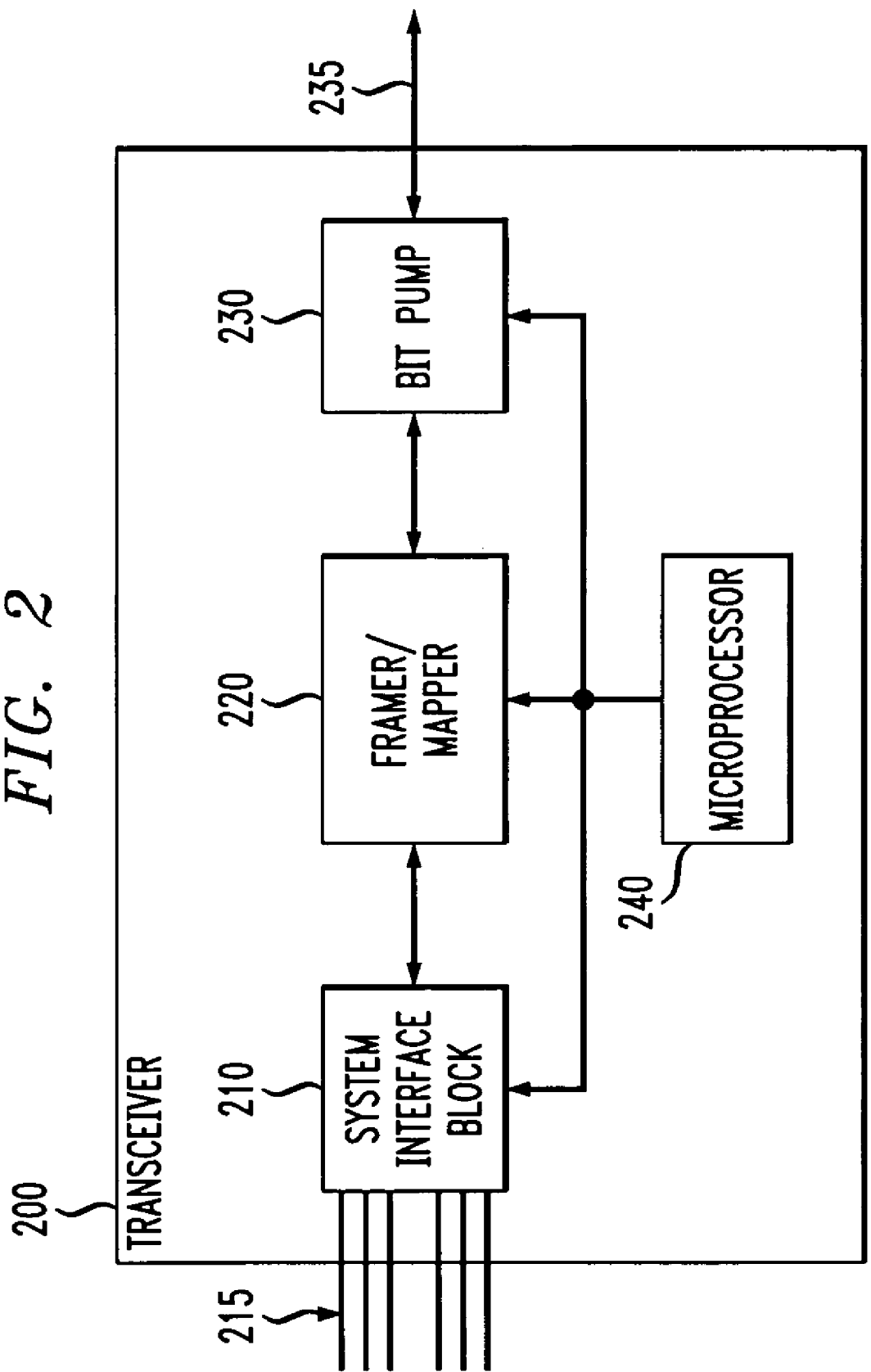
FIG. 2 illustrates a block diagram of an embodiment of a transceiver constructed according to the principles of the present invention.

Turning now to FIG. 2, illustrated is a block diagram of an embodiment of a transceiver 200 constructed according to the principles of the present invention. The transceiver 200 includes a system interface block 210 that provides an interface to, for instance, the public switched telephone network via T1 trunks (one of which is designated 215). The system interface block 210 can support any one of a number of transport medium and standards in addition to the T1 payload. The system interface block 210 performs system level functions such as processing commands/status information and providing connectivity to an embedded operations channel and an external system processor. The embedded operations channel is typically a virtual communications channel embedded in the physical layer for inter-transceiver and network maintenance purposes. The external system processor, in conjunction with an internal microprocessor, configures the transceiver 200 and monitors the operational status of the transceiver 200.

The transceiver 200 also includes a framer/mapper 220 coupled to the system interface block 210. The framer/mapper 220 provides transmission convergence between the standard interface block 210 and the frames associated with the information traversing a twisted pair wire (e.g., the HDSL2 frames). In conjunction therewith, the framer/mapper 220 provides frame synchronization, bit stuffing, jitter control processing and rate correction. The framer/mapper 220 also multiplexes/demultiplexes the channels associated with the transceiver 200, provides payload error detection and scrambles/descrambles signals in accordance with a particular application. Thus, the framer/mapper 220 is principally responsible for the transmission convergence within the transceiver 200.

The transceiver 200 further includes a bit pump 230 coupled to the framer/mapper 220. The bit pump 230 is the digital signal processing portion of the transceiver 200 and is coupled, via an analog front end, to a twisted pair wire 235 adapted to carry the high-bit-rate digital subscriber line service. A transmit path of the bit pump 230 receives data bits from the framer/mapper 220 and converts the bit stream into, for instance, 72X oversampled, 3-bit data for transmission by a digital-to-analog converter associated with the analog front end over the twisted pair wire 235. A receive path of the bit pump 230 receives the 3-bit, 72X oversampled received data from an analog-to-digital converter associated with the analog front end and converts the received data to an output bit stream for delivery to a deframer and, ultimately, to the framer/mapper 220.

The bit pump 230 generally performs two classes of signal processing, namely, symbol-time referenced and symbol-time independent processing. The symbol-time referenced processing includes functions like echo cancellation and equalization whereas symbol-time independent processing includes functions like transmitter digital sigma/delta modulation. An architecture associated with an embodiment of a bit pump 230 will be described with respect to FIG. 3.

The transceiver 200 still further includes a controller (e.g., an on-chip control microprocessor) 240 coupled to the system interface block 210, the framer/mapper 220 and the bit pump 230. The controller 240 communicates with and coordinates the operations between the system interface block 210, the framer/mapper 220 and the bit pump 230. For instance, the controller 240 performs the initialization process for the transceiver 200 by, among other things, initializing selected registers in the framer/mapper 220 and the bit pump 230 to a known state. The controller 240 generally writes or reads data to/from the mapper/framer 220 and the bit pump 230 using a memory mapped input/output operation through a peripheral bridge. While the read/write memory operation is intended to be used in debugging, characterization and production testing, it is not generally employed in end user applications, except for a built-in self testing mode.

The controller 240, however, has access to and updates the registers of the framer/mapper 220 and bit pump 230 during activation (including initialization) and communication phases of the transceiver 200. The controller 240 receives information such as performance characteristics and bit pump attributes (e.g., filter lengths, gains and signal scale factors) and provides control commands to control the transceiver 200. With regard to the bit pump 230, for instance, the controller 240 provides control commands to, without limitation, enable coefficient updates, select update gains, enable convolution and delay line updates, and probe node selection. Once the transceiver 200 reaches data transparency (i.e., showtime), however, the bit pump 230 can process data without continuing intervention from the controller 240, assuming no exception event occurs. Regarding the system interface block 210, the controller 240 accesses system command and status registers used for configuration and control reset, diagnostics, activation, embedded operations channel processing and other functions. The controller 240 is also intricately involved in synchronizing the operation of the components and systems during all phases of operation of the transceiver 200.

It should be understood that the representative transceiver 200 is submitted for illustrative purposes only and other transceiver configurations compatible with the principles of the present invention may be employed as the application dictates.

Figure 3:
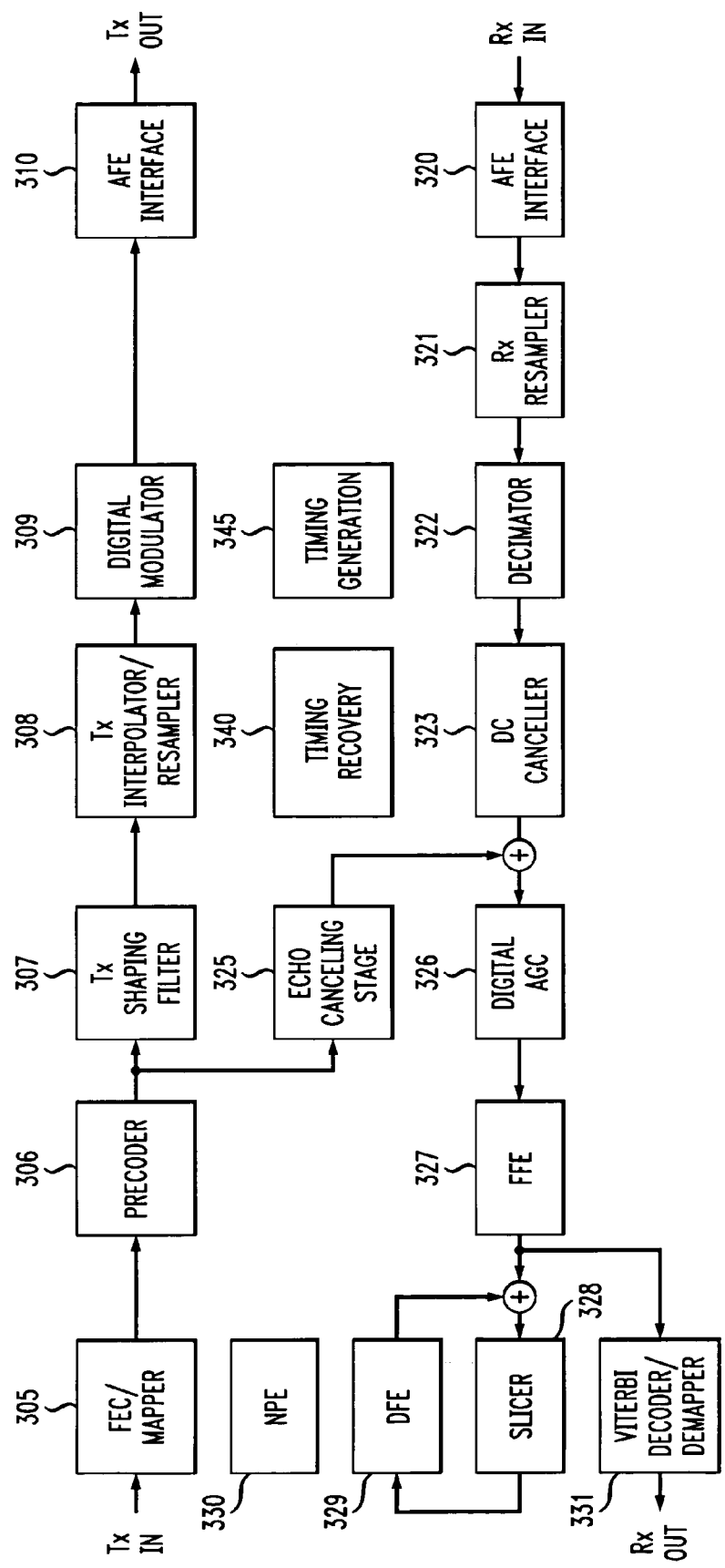
FIG. 3 illustrates a block diagram of an embodiment of a bit pump constructed according to the principles of the present invention.

Turning now to FIG. 3, illustrated is a block diagram of an embodiment of a bit pump 300 constructed according to the principles of the present invention. Again, the bit pump 300 primarily performs the digital signal processing functions associated with a transceiver and includes a transmit path and a receive path. While various blocks of the bit pump 300 are illustrated and described with respect to a transmitter or receiver portion of the bit pump 300, it should be understood that the circuits and systems that constitute the respective blocks perform functions on signals that span the bit pump 300 whether propagating along the transmit or receive path. Additionally, the functions associated with each block of the bit pump 300 are not necessarily discrete in nature. As will become more apparent, the functions are often integrated and resources are drawn from one functional block in the context another block to achieve the intended purpose. Finally, it should be understood that the circuits and systems associated with the present invention may be embodied in software, dedicated or hardwired discrete or integrated circuitry, or combinations thereof.

The bit pump 300 includes a forward error correction/mapper 305 coupled to an input of the transmit path. A signal presented at the input of the transmit path may be subject to various types of noise, in particular impulse noise, which is characteristically of short duration, but has a strong magnitude and a wide spectrum footprint. To provide a more reliable link, it is desirable to use a forward error correction coding techniques (e.g., a Reed-Solomon code) which are known to support reliable impulse noise resistance. Furthermore, the impulse noise immunity may be multiplied by a factor without additional redundancy by using forward error correction coding in conjunction with interleaving, where the factor is referred to as the depth of interleaving. Thus, the forward error correction/mapper 305 provides the forward error correction to a transmit signal presented at the input of the transmit path of the bit pump 300.

The bit pump 300 also includes a precoder 306 coupled to the forward error correction/mapper 305 in the transmit path. The precoder (e.g., commonly referred to as a channel precoder in the HDSL2 standard defined by the ANSI committee T1E1.4) is generally a fixed, non-linear filter that effectively implements a decision feedback equalization function in the transmitter portion of the bit pump 300. More specifically, the precoder 306 pre-distorts the transmitted signal so that after a corresponding receive signal propagating along the receive path passes through a feed forward equalization stage, there is insignificant post-cursor intersymbol interference distortion (or interference between adjacent data symbols caused by path distortion).

The precoder 306 is programmed by a controller of a transceiver (analogous to the controller 240 described with respect to FIG. 2) with decision feedback equalization coefficients that are calculated within the receiver portion of the bit pump 300 during activation. A motivation for using the precoder (e.g., a Tomlinson-Harashima precoder) 306 in lieu of a decision feedback equalizer at showtime is that the decision feedback equalization function is incompatible with a Viterbi decoder. To simultaneously realize the coding gain provided by a Viterbi decoder and the intersymbol interference cancellation provided by a decision feedback equalizer without noise enhancement, either the decision feedback equalizer should be replaced with the precoder 306 at showtime or the Viterbi decoder and decision feedback equalizer should be replaced with a reduced-state sequence detector. The precoder 306 is typically more efficient than the reduced-state sequence detector and, as such, the bit pump 300 employs the precoder 306 in the transmitter portion thereof.

The precoder 306, therefore, also employs a decision feedback equalizer 329 and noise prediction equalizer 330 associated with the receiver portion of the bit pump 300. The decision feedback equalizer 329 and noise prediction equalizer 330 are trained during activation to perform equalization in conjunction with other tasks necessary to operate the bit pump 300 and then reconfigured (by a controller command) at showtime to perform the functions associated with the precoder 306. Thus, the complexity of the precoder 306 is reduced. An input signal to the precoder 306 includes symbols from the forward error correction/mapper 305 and an output of the precoder 306 is a substantially white, uniform distributed signal sampled at the symbol rate.

The bit pump 300 also includes a transmitter shaping filter 307 coupled to the precoder 306 in the transmit path. The transmitter shaping filter 307 is a typically a finite impulse response (non-adaptive) digital filter that receives data at a 1× rate, interpolates to a 4× rate, and shapes the power spectrum density of the resulting 4× rate signal. The finite impulse response filter is programmable (i.e., the filter coefficients are stored in random access memory/registers) and the default settings for the transmitter shaping filter 307 are generally unknown, meaning that the transmitter shaping filter 307 is programmed by the controller at powerup. In an exemplary embodiment of the present invention, the transmitter shaping filter 307 can accommodate DSL-based technology and is compatible with the requirements associated with HDSL2. For instance, the length of the filter (e.g., 128 taps) is designed to meet the requirements associated with HDSL2.

The programmability of the transmitter shaping filter 307 provides several advantages for the bit pump 300. First, it allows the bit pump 300 to be applied in multi-rate or repeater applications. It also allows the system signal-to-noise ratio slicer margins to be improved when reductions can be made in component tolerances in the line interface to the bit pump 300. That is, tighter tolerances allow the transmit spectra to be refined to be closer to the upper bound set forth in the HDSL2 standard.

The bit pump 300 also includes a transmitter interpolator/resampler 308 coupled to the transmitter shaping filter 307 in the transmit path. The transmitter interpolator/resampler 308 upsamples the output of the transmitter shaping filter 307 to a sampling rate compatible with a digital modulator 309 coupled thereto. The architecture of the transmitter interpolator/resampler 308 generally employs a multiplier-free architecture based on a cascaded-integrator-comb interpolator [see, for instance, "An Economical Class of Digital Filters for Decimation and Interpolation," by E. B. Hogenauer, Institute of Electronic and Electrical Engineers (IEEE) Transactions on Acoustics, Speech, and Signal Processing, Vol. ASSP-29, No. 2, April 1981, which is incorporated by reference] to upsample from $4*F_{baud}$ to $72*F_{baud}$ followed by a first order Lagrange (linear) interpolator to resample the $72*F_{baud}$ output. The interpolator, therefore, increases the sampling rate by a factor of 18 (i.e., 72/4).

When determining the order (length) of the cascade-integrator-comb interpolator, there are generally two considerations, namely, the image attenuation and the passband droop. The interpolator is designed to suppress the images of the baseband signal such that the signals are below the level of the shaped quantization noise floor of the digital modulator 309. A fourth order cascade-integrator-comb interpolator should be adequate to ensure that the images in the transmit path are below (~5 dB) the level of the quantization noise.

Once the interpolation filter is chosen, any passband droop caused by that filter can be compensated for in the transmit path and typically by the transmitter shaping filter 307. While the compensation function increases the peak to root-mean-square ratio of the transmitter shaping filter 307, it does not significantly alter the peak to root-mean-square ratio of a signal arriving at the digital modulator 309 since the extra peaking added to compensate for the droop is removed by the cascaded-integrator-comb interpolator prior to reaching the digital modulator 309.

In addition to the above considerations, the overall gain of the cascaded-integrator-comb interpolator should be compensated for in the transmit path. The cascaded-integrator-comb interpolator in conjunction with the coefficients associated with the transmitter shaping filter 307 should be adequate to compensate the overall gain.

The resampler section (e.g., a linear interpolating resampler) of the transmitter interpolator/resampler 308 resamples the output of the interpolator according to the sampling phase and input delay-line shifts specified by a timing generator 345 associated with the bit pump 300. Thus, the transmitter interpolator/resampler 308 provides sampling phase and frequency corrections to the transmit signal for delivery to the digital modulator 309.

The digital modulator (e.g., a second order modulator) 309, coupled to the transmitter interpolator/resampler 308 in the transmit path, generally produces a 5-level output signal with the quantization noise shaped to minimize the noise in the passband. A transmitter analog-front-end interface 310 receives the 5-level quantized output signal from the digital modulator 309, converts the signal to an analog signal (via a digital-to-analog converter) and provides an interface at an output of the transmit path of the bit pump 300. Both the digital modulator 309 and the transmitter analog-front-end interface 310 typically operate on a common 144× clock, with a transfer rate of 72× (the sample rate) desired. To facilitate this, the transmitter analog-front-end interface 310 generates a 72× sample transfer clock signal and the 5-level quantized output is coded into three bits. The output data from the bit-pump 300 changes at the rising edge of the sample transfer clock signal and the transmitter analog-front-end interface 310 should sample the digital modulator 309 output data at the falling edge of the sample transfer clock signal.

Turning now to the receiver portion of the bit pump 300, a receiver analog-front-end interface 320 is coupled to an input of the receive path of the bit pump 300. The receiver analog-front-end interface 320 receives an analog signal from an HDSL2 path and converts the signal to a digital signal via a analog-to-digital converter associated therewith. The analog-to-digital converter and the bit pump 300 typically operate on a common 144× clock and a transfer rate of 72× (the sample rate) is desirable. The output of the analog-to-digital converter advantageously includes three single-bit outputs, which are grouped into a three-bit bus. The data at the output of the receiver analog-front-end interface 320 transitions at the rising edge of the clock pulse and the bit-pump 300 samples the analog-to-digital converter input data at the falling edge of the clock pulse.

The bit pump 300 also includes a receiver resampler 321 coupled to the receiver analog-front-end interface 320 in the receive path. The receiver resampler (including, for instance, a third order LaGrange interpolation stage and a linear interpolating stage) 321 merges the three outputs of the analog-to-digital converter from the receiver analog-front-end interface 320 into a single output and resamples the signal to phase-lock the sampling phase associated with a remote terminal and central office of a communication network employing the bit pump 300. In the central office, the transmit and receive timing is generally locked to a local oscillator and therefore fractional resampling is unnecessary. In the remote terminal, the signals associated with the timing generator 345 and receiver resampler 321 necessitate sampling phase, input delay-line shifts and output sample production times to synchronize a derived symbol clock to the remote terminal's local oscillator associated with the timing generator 345. A more detailed explanation of an embodiment of a resampler follows with respect to FIG. 4.

The bit pump 300 also includes a decimator 322 coupled to the receiver resampler 321 in the receive path. The decimator 322 downsamples the output of the receive resampler 321 from the $72*F_{baud}$ to a $2*F_{baud}$ symbol rate. The decimator 322 generally includes the following cascaded filter elements, namely, a cascaded-integrator-comb decimator to downsample from $72*F_{baud}$ to $8*F_{baud}$, a fifth order power-symmetric decimation filter to decimate from $8*F_{baud}$ to $4*F_{baud}$, and a seventh order power-symmetric decimation filter to decimate from $4*F_{baud}$ to $2*F_{baud}$.

The first decimation filter element uses a multiplier-free architecture based on the cascaded-integrator-comb filter structure analogous to the structure employed in the transmitter interpolator/resampler 308. The following two factors may be used to determine the decimation ratio and cascaded-integrator-comb filter order, namely, the quantization noise aliasing and the passband attenuation. In general, the lower the output sample rate, the greater the attenuation at the edge of the passband for a fixed bandwidth passband. For instance, employing a cascaded-integrator-comb decimation ratio of 18 to produce a $4*F_{baud}$ output, the attenuation at the edge of the passband in the signal received by the remote terminal would be ~2.8 dB for a filter that would provide ~68 dB of quantization noise suppression. If instead a cascaded-integrator-comb decimation ratio of nine is selected, the attenuation at the edge of the passband is reduced to ~0.7 dB with ~95 dB quantization noise suppression. To keep the decimator 322 from hindering the analog-digital-converter performance, a decimation ratio of nine and a filter order of five is suggested.

The second decimation filter element uses a canonical-signed-digit multiplier architecture based on the power-symmetric elliptic impulse response filter structure. Although such filters are based on equiripple, elliptic filters, the resulting filter from coefficient quantization is generally not considered elliptic since passband and stopband are no longer equiripple. Nevertheless, the power-symmetric property is maintained after coefficient quantization. It is this property that ensures that for an acceptable stopband attenuation, passband ripple will be insignificant. The second decimation filter is a fifth order power-symmetric decimation filter.

The third decimation filter element also uses a power-symmetric infinite impulse response filter structure. The third decimation filter is a seventh order power-symmetric decimation filter. Thus, the decimator 322 allows sampling phase and frequency corrections to be made on the receive signal propagating along the receive path. For a better understanding of the design criteria associated with such filter elements, see "Multirate Systems and Filter Banks," by P. P. Vaidyanathan, Prentice Hall Signal Processing Series, Chap. 5, Section 5.3, pp. 211–213, July 1992, which is incorporated herein by reference.

The bit pump 300 also includes a DC canceller 323 coupled to the decimator 322 in the receive path. In presence of fixed-point elements, such as a digital-to-analog converter, there is a possibility of a parasitic DC component in a canceled echo signal. While this component does not affect the residual echo root-mean-square value, it presents a concern regarding a feed forward and decision feedback equalization combination due to the lack of a transmitted signal. This artifact may account for as much as 1 dB of slicer mean squared errors at steady state operation. The DC canceller 323 (including, for instance, a single tap least-mean-square filter adapting to the steady value of one) is designed to reduce this degradation.

The bit pump 300 also includes an echo canceling stage 325 interposed between the transmit and receive path. The echo canceling stage 325 substantially cancels linear echo over the full dynamic range of the bit pump 300. The echo canceling stage 315 may be partitioned into master and slave echo canceling stages (e.g., hybrid digital filters) to assist in further defining and ultimately reducing the echo. Another advantage associated with this architecture is an enhanced capability to accommodate both updates and disturber or other perturbations during showtime operation. A significant perturbation may be caused by a changing or slewing of the ambient temperature during steady-state or showtime operation. The perturbation typically causes a significant degradation in system performance of a conventional echo canceller. In particular, it can account for as much as 4.7 dB of allocated signal-to-noise margin.

The bit pump 300 also includes a digital automatic gain controller 326 coupled to the DC canceller 323 in the receive path. The digital automatic gain controller 326 allows the bit pump 300 to process the data precisions that follow the echo canceling stage 325. The digital automatic gain controller 326 also employs a least-mean-square algorithm to train a feed forward equalization function without normalization.

More specifically, the digital automatic gain controller 326 limits the probability of clipping (generally the signal peaks of the analog-to-digital and digital-to-analog converters) to a desired level by means of fixing the output signal variance. A secondary effect of this operation is to alleviate the need for error normalization in feed forward equalization least-mean-square algorithm and to reduce the dynamic range requirement for feed forward equalization coefficients.

The bit pump 300 also includes an equalizer coupled to the DC canceller 323 and the echo canceling stage 325 in the receive path. The equalizer includes a feed forward equalizer 327, decision feedback equalizer 329 and a noise prediction equalizer 330. The feed forward equalizer 327 cooperates with the decision feedback equalizer 329 to whiten noise and equalize a linear distortion associated with the receive path. For instance, with 384 taps, the feed forward equalizer 327 can come within 0.2 dB of the optimal (signal-to-noise ratio margin) performance on a higher level standard noise case. The noise prediction equalizer 330 removes any correlation which may be left in the error signal after the equalization function. The noise prediction equalizer 330 also accelerates convergence within the bit pump 300. Portions of the equalizer can be reconfigured at showtime to become part of the precoder 306.

The bit pump 300 also includes a slicer 328 and a Viterbi decoder/demapper 331 coupled to a summing node with the equalizer in the receive path. The slicer 328 is a symbol-by-symbol decoder configured to slice pulse amplitude modulated signals in the bit pump 300 including signals associated with the echo canceling stage 325. The Viterbi decoder/demapper 331 decodes a 512-state code recommended in the HDSL2 standard and demaps the receive signal for egress from an output of the receive path of the bit pump 300.

The bit pump 300 also includes a timing recoverer 340 and timing generator 345. The timing recoverer 340 allows very fine control of sampling timing with very little jitter. For example, the transmit jitter in the remote terminal is generally small enough that a jitter echo canceller is not necessary. The timing generator 345 is proximally located between the timing recoverer 340 and the transmitter resampler of the transmitter interpolator/resampler 308 and the receiver resampler 321. The timing recoverer 340 is generally a phase detector and frequency integrator. A burst phase correction and updated frequency estimate are generally computed every 400 symbols by timing recovery and sent to the timing generator 345 to be used to control the transmitter resampler and the receiver resampler 321.

In the timing generator 345 and transmitter and receiver resamplers 321, the nominal sampling rate is $72*F_{baud}$, thereby allowing the sampling phase to be maintained with reference to 72x samples as described above. Additionally, the various elements of the timing generator 345 may be controlled by a central state machine which dictates when transmit and receive samples are to be generated and when transmit and receive input delay lines are to be advanced.

It should be understood, that the representative bit pump 300 is submitted for illustrative purposes only and other bit pump configurations compatible with the principles of the present invention may be employed as the application dictates. The following FIGUREs illustrate embodiments of a resampler constructed according to principles of the present invention. A goal in –designing the resampler is to achieve a performance that exceeds that of the analog-to-digital converter by about 6 dB. As a result, the target performance for the resampler may advantageously be set to be greater than about 86 dB. The embodiments of the resampler that follow can achieve the desired level of performance over the central office transmit bandwidth with a typical worst-case distortion of –81.51 dB for a 375 kHz sinusoidal input.

Figure 4:
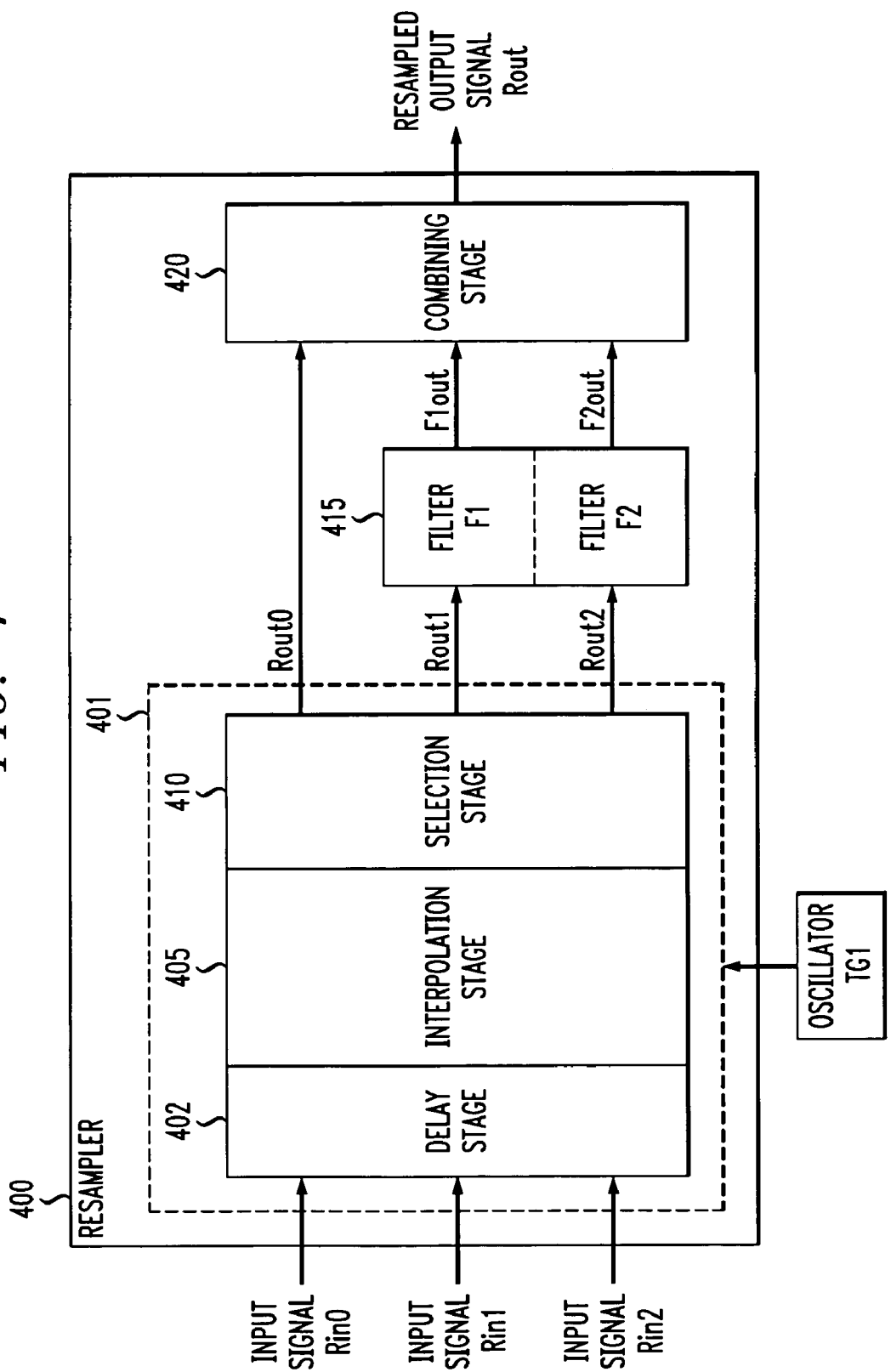
FIG. 4 illustrates a block diagram of an embodiment of a resampler constructed according to the principles of the present invention.

Turning now to FIG. 4, illustrated is a block diagram of an embodiment of a resampler 400 constructed according to the principles of the present invention. The resampler 400, including a front end 401, a filter stage 415 and a combining stage 420, receives first, second and third input signals Rin0, Rin1, Rin2 and provides a resampled output signal Rout. The front end 401 includes a delay stage 402, an interpolation stage 405 and a selection stage 410. The delay stage 402 is coupled to the first, second and third input signals Rin0, Rin1, Rin2, the interpolation stage 405 is interposed between the delay and selection stages 402, 410, and the selection stage 410 is coupled to an oscillator TG1. The selection stage 410 provides first, second and third front end output signals or samples Rout0, Rout1, Rout2.

The filter stage 415, including first and second filter sections F1, F2, receives the second and third front end output signals Rout1, Rout2 and provides first and second filter output signals F1out, F2out, respectively. The combining stage 420 receives the first front end output signal Rout0 and the first and second filter output signals F1out, F2out and provides the resampled output signal Rout.

The resampler 400, in the illustrated embodiment, accepts three single-bit data streams from an analog-to-digital converter located in an analog-front-end interface associated with a bit pump (see, for instance, the analog-front-end interface 310 of the bit pump 300 illustrated and described with respect to FIG. 3). The resampler 400 operating, in part, as a linear interpolating resampler merges the three single-bit data streams into a single output by resampling the receive signal associated with a remote terminal. The resampled signal provides a phase-lock to a sampling phase of the oscillator TG1, which is a local oscillator associated with a timing generator of the bit pump (see, for instance, the timing generator 345 of the bit pump 300 illustrated and described with respect to FIG. 3).

The resampler 400, in the illustrated embodiment, is reconfigured from a conventional arrangement and embodies a merging of two logically distinct functions. This organization generally allows a reduction in overall operational complexity. In particular, the resampler 400 receives the first, second and third input signals Rin0, Rin1, Rin2 of the resampler 400, which are single-bit inputs (i.e., +1 or –1), and provides the resampled output signal Rout typically in the form of a 23 bit (i.e., ranging from –89 to +89) signal. This organization provides the benefit of simplifying the digital filtering associated with the resampler 400.

By positioning the interpolation stage 405 and the selection stage 410 at the input of the resampler 400 before the combining stage 420, the need for a hardware multiplier is eliminated due to the relative simplicity of multiplying the single-bit input signals. In the illustrated embodiment, the three input signals Rin0, Rin1, Rin2 employ three separate sections, associated with the interpolation and selection stages 405, 410, respectively. As mentioned before, however, the sections are less complex to implement, demand less power and require less real estate than resamplers of the past.

The interpolation stage 405 manipulates the three input signals Rin0, Rin1, Rin2, which represent at least a portion of a receive signal propagating along the receive path of the bit pump and generates a plurality of intermediate samples from at least two input samples associated with the one-bit input signals. Although the illustrated embodiment is configured to receive three parallel input signals, other embodiments that include a different number of input signals including a single, one-bit input signal are well within the broad scope of the present invention. Additionally, the interpolation stage 405 may employ more than two input samples to generate the plurality of intermediate samples as will be discussed in the illustrated embodiments. The selection stage 410, coupled to the interpolation stage 405, is configured to select one of the plurality of intermediate samples thereby providing an output sample (e.g., the first, second and third front end output signals Rout0, Rout1, Rout2) that corresponds to a phase of the oscillator TG1.

The first filter section F1 is a second order high pass filter, and the second filter section F2 is a third order high pass filter, in the illustrated embodiment. The first filter output signal F1out of the first filter section F1 may be represented by $$F1out = (1-z^{-1})^2,$$

and the second filter output signal F2out of the second filter section F2 may be represented by.

$$F2out = (1-z^{-1})^3,$$

where z is a unit delay.

The combining stage 420, as stated earlier, receives the first front end output signal Rout0 along with the first and second filter output signals F1out, F2out and combines them into the single resampled output signal Rout. In the illustrated embodiment, this action is accomplished through a collection of appropriately connected adder circuits. The resultant resampled output signal Rout then represents a single sample from the analog-to-digital converter that has been synchronized to the appropriate sample phase of the oscillator TG1.

Figure 5:
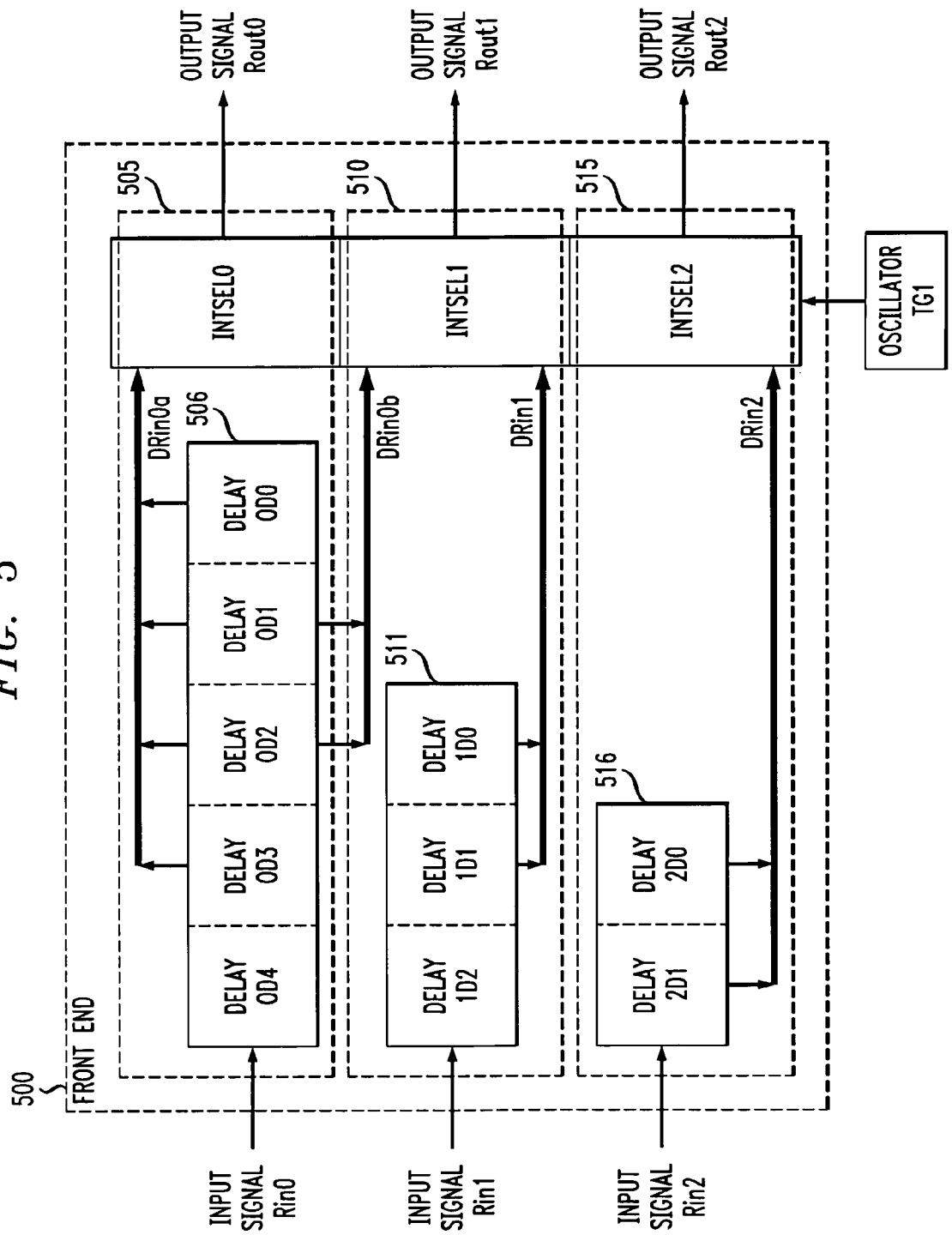
FIG. 5 illustrates a block diagram of an embodiment of a front end of the resampler of FIG. 4 constructed according to the principles of the present invention.

Turning now to FIG. 5, illustrated is a block diagram of an embodiment of a front end 500 of the resampler 400 of FIG. 4 constructed according to the principles of the present invention. The front end 500 includes first, second and third sections 505, 510, 515. The first section 505 includes a first input signal delay line 506 that receives the first input signal Rin0 and a first interpolator/selector INTSEL0 that provides the first front end output signal or sample Rout0. The second section 510 includes a second input signal delay line 511 that receives the second input signal Rin1 and a second interpolator/selector INTSEL1 that provides the second front end output signal or sample Rout1. The third section 515 includes a third input signal delay line 515 that receives the third input signal Rin2 and a third interpolator/selector INTSEL2 that provides the third front end output signal or sample Rout2.

The first input-signal delay line 506 includes first, second, third, fourth and fifth first-signal delay stages DELAY0D0, DELAY0D1, DELAY0D2, DELAY0D3, DELAY0D40 that each delay the single-bit input signal by one sample delay, respectively. A primary first-signal delayed group DRin0a, which includes parallel outputs from the first, second, third and fourth first-signal delay stages DELAY0D0, DELAY0D1, DELAY0D2, DELAY0D3, serves as a representation of the first input signal Rin0 that is provided to the first interpolator/selector INTSEL0. The first interpolator/selector INTSEL0 employs the primary first-signal delayed group DRin0a and a signal from the oscillator TG1 to function as, in the illustrated embodiment, a merged third-order LaGrange interpolator (or interpolation filter). The third-order algorithm employs four signal samples of the first input signal Rin0 and a sample phase of the oscillator TG1, which generally has $2^{16}$ possible intermediate sample positions, to accomplish its interpolation and selection functions. A more comprehensive discussion of the merged third-order LaGrange interpolator is set forth with respect to FIG. 6 below.

The second input-signal delay line 511 includes first, second, and third second-signal delay stages DELAY1D0, DELAY1D1, DELAY1D2 that each delay the second single-bit input signal by one sample delay, respectively. A second-signal delayed group DRin1, which includes parallel outputs from the first and second second-signal delay stages DELAY1D0, DELAY1D1, serves as a representation of the second input signal Rin1 that is provided to the second interpolator/selector INTSEL1. Additionally, an alternative first-signal delayed group DRin0b, which includes parallel outputs from the second and third first-signal delay stages DELAY0D1, DELAY0D2, serves as a representation of the first input signal Rin0 that is provided to the second interpolator/selector INTSEL1.

The second interpolator/selector INTSEL1 employs the alternative first-signal delayed group DRin0b and the second-signal delayed group DRin1 along with a signal from the oscillator TG1 to function as a first-order linear interpolator (or interpolation filter). This first-order linear interpolator employs two signal samples representing each of the first and second input signals Rin0, Rin1 and the sample phase of the oscillator TG1 to accomplish its interpolation and selection functions. A more comprehensive discussion of the first-order linear interpolator is presented in U.S. patent application Ser. No. 09/652,116, entitled "Resampler for a Bit Pump and Method of Resampling a Signal Associated Therewith." The second front end output signal Rout1 actually includes two parallel outputs representing each of the resampled first and second input signals Rin0, Rin1. These two resampled signals serve as inputs to the first filter section F1 illustrated in FIG. 4.

The third input-signal delay line 516 includes first and second third-signal delay stages DELAY2D0, DELAY2D1 that each delay the third single-bit input signal by one sample delay. A third-signal delayed group DRin2, which includes parallel outputs from the first and second third-signal delay stages DELAY1D0, DELAY1D1, serves as a representation of the third input signal Rin2 that is provided to the third interpolator/selector INTSEL2.

The third interpolator/selector INTSEL2 employs the third-signal delayed group DRin2 along with a signal from the oscillator TG1 to also function as a first-order linear interpolator (or interpolation filter). This first-order linear-interpolator employs two signal samples of second input signal Rin2 and the sample phase of the oscillator TG1 to accomplish its interpolation and selection functions. The third front end output signal Rout2 serves as the input to the second filter section F2 illustrated in FIG. 4.

Since the delay lines involve single bits into the first and third interpolator/selectors INTSEL0, INTSEL2 and pairs of single bits into the second interpolator/selector INTSEL1, the phase selection operation effectively turns into a logic operation due to the less complex samples and coefficients employed. Also, as a consequence of employing the upper nine bits of data associated with the oscillator TGI, the second and third interpolator/selectors INTSEL1, INTSEL2 can accommodate up to 512 possible intermediate samples. The first interpolator/selector INTSEL0, however, may employ all 16 bits of data associated with the oscillator TG1 thereby increasing the number of intermediate samples available thereto.

In the context of the two high-pass filtered signals, a linear interpolating resampler results in a modulation of the output level of the analog-to-digital converter (see discussion with respect to FIG. 4). Alternatively, a zero-order hold resampler could be employed to select the appropriate sample although a degradation in performance may result. The primary advantage afforded by a linear-interpolating resampler is the ease of producing coefficients as they are simply the sampling phase fraction. Any higher-order interpolation filter generally requires a larger coefficient table.

Figure 6:
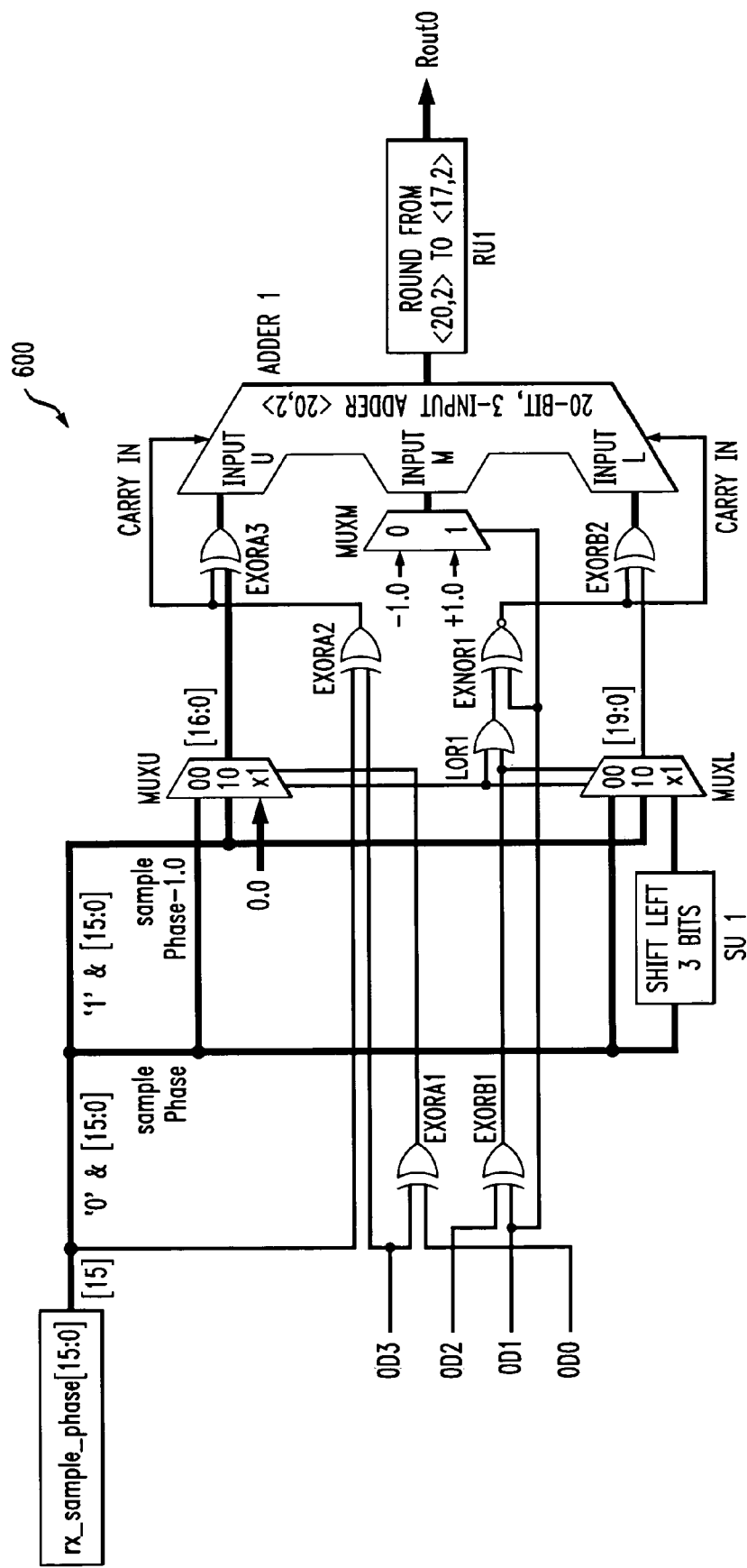
FIG. 6 illustrates a schematic diagram of an embodiment of an interpolation and selection stage constructed according to the principles of the present invention.

Turning now to FIG. 6, illustrated is a schematic diagram of an embodiment of an interpolation and selection stage 600 (employable, for instance, as the first interpolator/selector INTSEL0 of the front end 500 of FIG. 5) constructed according to the principles of the present invention. As indicated by the illustrated embodiment, the interpolation and selection stage 600 is embodied in an integrated or merged logic function. Of course, the functionality associated with the first interpolator/selector INTSEL0 may also be embodied in a discrete manner in another embodiment.

An interpolation portion of the interpolation and selection stage 600 employs a cascaded architecture to interpolate a one-bit input signal received at an input thereto. The interpolation portion includes a multiple order interpolation filter that generates a sample range from at least three input samples associated with the one-bit input signal. The interpolation portion further includes a linear interpolation filter, associated with the multiple order interpolation filter, that develops a plurality of samples within the sample range. The integrated or merged multiple order interpolation filter is generally embodied as a finite impulse response filter that uses weighted summations of current and past input samples and does not require feedback to implement.

As stated above, multiple sets of coefficients may be taken for multiple phase points of an input sample. For example, three sets of coefficients may be taken at phases representing zero, 180 and 360 degrees. Then, using a desired phase taken modulo 0.5 (180 degrees), linear interpolation between sets of first and second coefficients or sets of second and third coefficients may be accomplished. The first and second coefficient sets may be selected if a sampling phase lies between zero and 180 degrees. Otherwise, the second and third coefficient sets may be selected. In this manner, only one additional term must be added to produce an interpolated output.

The interpolation and selection stage 600 includes an adder ADDER1 having upper, middle and lower adder inputs INPUTU, INPUTM, INPUTL and an output coupled to a rounding unit RU1 that provides an output signal (e.g., the output signal Rout0 illustrated with respect to FIG. 5). The interpolation and selection stage 600 also includes upper, middle and lower multiplexers MUXU, MUXM, MUXL and a shift unit SU1 coupled to the lower multiplexer MUXL. The interpolation and selection stage 600 further includes a first collection of exclusive-OR gates EXORA having first, second and third exclusive-OR gates EXORA1, EXORA2, EXORA3. The interpolation and selection stage 600 still further includes a second collection of exclusive-OR gates EXORB having fourth and fifth exclusive-OR gates EXORB1, EXORB2, a logical-OR gate LOR1 and an exclusive-NOR gate EXNOR1.

In the environment as illustrated and described with respect to FIG. 5, the interpolation and selection stage 600 receives inputs from the first input signal delay line 506 and the oscillator TG1 and provides the first front end output signal Rout0. The interpolation and selection stage 600 employs the primary first-signal delayed group DRin0$a$ and a signal from the oscillator TG1 to function as a merged multiple order (e.g., a third-order LaGrange interpolate-by-2) with linear interpolation. The third-order algorithm employs four signal samples of the first input signal Rin0 and a sample phase signal of the oscillator TG1, which generally has $2^{16}$ possible intermediate sample positions, to accomplish its interpolation and selection functions.

The third order LaGrange interpolate-by-2 functions as a low-pass filter, which uses four coefficients h[0.3](or input-sample tap weights). These may be expressed as a function of a desired delay D between 1.0 and 2.0 samples and are shown below. The first coefficient h[0] multiplies by the most-recent input sample:

$$h[0]=-(D-1)\ (D-2)\ (D-3)/6.$$

The second coefficient h[1] multiplies by the second most-recent input sample:

$$h[1]=(D-2)\ (D-3)/2.$$

The third coefficient h[2] multiplies by the third most-recent input sample:

$$h[2]=(D-1)\ (D-3)/2.$$

The fourth coefficient h[3] multiplies by the fourth most-recent input sample:

$$h[3]=D(D-1)(D-2)/6.$$

In the illustrated embodiment, an interpolate-by-2, indicates that the only value of the delay D of interest is that value that produces an output sample halfway between the middle pair of input samples. That is, the delay D equals a value of 1.5.

Thus, the coefficients used in the implementation are as follows:

$$h[0] = -(1.5-1)(1.5-2)(1.5-3)/6,$$
$$= -(0.5)(-0.5)(-1.5)/6,$$
$$= -1/16;$$

$$h[1] = 1.5(1.5-2)(1.5-3)/2,$$
$$= 1.5(-0.5)(-1.5)/2,$$
$$= 9/16;$$

$$h[2] = 1.5(1.5-1)(1.5-3)/2,$$
$$= -1.5(0.5)(-1.5)/2,$$
$$= 9/16;$$

$$h[3] = 1.5(1.5-1)(1.5-2)/6,$$
$$= 1.5(0.5)(-0.5)/6,$$
$$= -1/16.$$

It is also useful to know what the third order LaGrange interpolation filter does for a delay D equal to values of 1.0 and 2.0. Table 1 below summarizes the coefficients for the third order LaGrange interpolation filter for the delay D equal to values of 2.0, 1.5, and 1.0. This order is chosen because it follows from oldest to newest sample and the sample phase going from a value of zero that selects the oldest to 1.0 that selects the newest sample.

TABLE 1

| D = 2.0 | D = 1.5 | D = 1.0 |
|---|---|---|
| h[0] = 0 | h[0] = -1/16 | h[0] = 0 |
| h[1] = 0 | h[1] = 9/16 | h[1] = 1 |
| h[2] = 1 | h[2] = 9/16 | h[2] = 0 |
| h[3] = 0 | h[3] = -1/16 | h[3] = 0 |

In the illustrated embodiment, a linear interpolator is a low-pass filter that employs the following two coefficients h[0,1], (or input sample tap weights) as a function of the desired delay D, between 0.0 and 1.0 samples. This results in the first coefficient h[0], which multiplies by the most recent input sample having a value expressed by:

$$h[0]=1-D, \text{ and}$$

the second coefficient h[1], which multiplies by the second most-recent input sample having a value expressed by:

$$h[1]=D.$$

In the illustrated implementation, the sample phase ranges from zero to 1.0 corresponding to the delay D ranging from 1.0 to zero. The following rewriting of the equations for the coefficients above uses the substitution:

$$D=1-rxSamplePhase,$$

where rxSamplePhase represents the value of the sample phase of an oscillator.

Therefore:

$$h[0]=rxSamplePhase, \text{ and}$$

$$h[1]=1-rxSamplePhase.$$

Tables 2A and 2B below give the input-sample coefficients for the merged third order LaGrange interpolate-by-2 with linear interpolator. Since a third order LaGrange first stage is used, four taps or coefficients must be used.

TABLE 2A

| 0 ≤ rxSamplePhase < 0.5 | 0.5 ≤ rxSamplePhase < 1.0 |
|---|---|
| h[0] = -1/16 * (2 * rxSamplePhase) | h[0] = -1/16 + 1/16 * (2 * (rxSamplePhase - 0.5)) |
| h[1] = 9/16 * (2 * rxSamplePhase) | h[1] = 9/16 + 7/16 * (2 * (rxSamplePhase - 0.5)) |
| h[2] = 1 - 7/16 * (2 * rxSamplePhase) | h[2] = 9/16 - 9/16 * (2 * (rxSamplePhase - 0.5)) |
| h[3] = -1/16 * (2 * rxSamplePhase) | h[3] = -1/16 + 1/16 * (2 * (rxSamplePhase - 0.5)) |

Rewriting Table 2A provides Table 2B below.

TABLE 2B

| 0 ≤ rxSamplePhase < 0.5 | 0.5 ≤ rxSamplePhase < 1.0 |
|---|---|
| h[0] = -1/8 * rxSamplePhase | h[0] = 1/8 * (rxSamplePhase - 1.0) |
| h[1] = 9/8 * rxSamplePhase | h[1] = 1.0 + 7/8 * (rxSamplePhase - 1.0) |

TABLE 2B-continued

| 0 ≤ rxSamplePhase < 0.5 | 0.5 ≤ rxSamplePhase < 1.0 |
|---|---|
| h[2] = 1.0 - 7/8 * rxSamplePhase | h[2] = -9/8 * (rxSamplePhase - 1.0) |
| h[3] = -1/8 * rxSamplePhase | h[3] = 1/8 * (rxSamplePhase - 1.0) |

Recall that the input samples are single-bit values and represent a value of either -1.0 or +1.0. Also, observe that coefficients h[0] and h[3] are identical and coefficients h[1] and h[2] are somewhat complementary. Again in relation to FIG. 5, recall that the first input signal delay line 506 includes first, second, third and fourth first-signal delay stages DELAY0D0, DELAY0D1, DELAY0D2, DELAY0D3 wherein their respective delay signals are designated as 0D0, 0D1, 0D2, 0D3.

Thus, in the environment of the embodiment of FIG. 5, each of these delay stages delay the single-bit input signal Rin0 by one sample delay, respectively. Therefore:

the most recent input sample=0D3, the second most recent input sample=0D2, the third most recent input sample=0D1, and the fourth most recent input sample=0D0.

A contribution of the outer pair of filter coefficients h[O], h[3] to the output of the interpolation and selection stage 600 may be designated as an outer pair contribution OPCh0$h$3. Then, $$OPCh0h3=h[0]*0D3+h[3]*0D0.$$

If (0≤rxSamplePhase<0.5), then $$OPCh0h3=-1/8*rxSamplePhase*(0D3+0D0),$$

else, if (0.5<rxSamplePhase<1.0), then $$OPCh0h3=1/8*rxSamplePhase*(0D3+0D0).$$

Since the input sample values are either +1.0 or -1.0, the sum of the delay signals designate as (0D0+0D0) can only assume the values of 2.0, -2.0 or 0.0. This leads to the following equations for the outer pair contribution OPCh0$h$3.

If (0<rxSamplePhase<0.5), then $$OPCh0h3=0, \text{ for } 0D3!=0D0,$$

$$OPCh0h3 =-1/4*rxSamplePhase, \text{ for } 0D3/0D0==1.0,$$

$$OPCh0h3=1/4*rxSamplePhase, \text{ for } 0D3/0D0==-1.0,$$

else, if (0.5≤rxSamplePhase<1.0), $$OPCh0h3=0, \text{ for } 0D3!=0D0,$$

$$OPCh0h3=1/4*(rxSamplePhase-1), \text{ for } 0D3/0D0==1.0,$$

$$OPCh0h3=-1/4*(rxSamplePhase-1), \text{ for } 0D3/0D==-1.0.$$

In FIG. 6, the upper adder input INPUTU receives the outer pair contribution OPCh0$h$3. The output of the first exclusive-OR gate EXORA1, whose inputs are the delay signals designated as 0D3, 0D0, has a value of one when (0D3=0D0). The output of the upper multiplexer MUXU provides values of either 0.0, rxSamplePhase or (rxSamplePhase-1.0). A value of 0.0 is provided when the output of the previously mentioned first exclusive-OR gate EXORA1 is asserted. Otherwise, the output of the upper multiplexer MUXU is the sample phase rxSamplePhase when (0≤rxSamplePhase<0.5), or (rxSamplePhase-1.0) when (0.5<rxSamplePhase<1.0).

The output of the upper multiplexor MUXU may be conditionally complemented by the third exclusive-OR gate EXORA3 whose output is connected directly to the upper adder input INPUTU. The controlling input to this complementing third exclusive-OR gate EXORA3 is the second exclusive-OR gate EXORA2, whose inputs are the sample phase rxSamplePhase[bit 15] and the delay signal designated as 0D3. The sample phase rxSamplePhase[bit 15] has a value of zero when ($0 \leq$ rxSamplePhase<0.5) and a value of one when ($0.5 \leq$ rxSamplePhase<1.0). The delay signal designated as 0D3 has a value of zero when it represents an input signal value of −1.0, and a value of one when it represents an input signal value of +1.0.

Thus, the output of the second exclusive-OR gate EXORA2 has a value of one when ($0 \leq$ rxSamplePhase<0.5) and 0D3==+1.0, or when ($0.5 \leq$ rxSamplePhase<1.0) and 0D3==−1.0. This corresponds to the negation of the outer pair contribution OPCh0$h$3 (+/−1/4). Note that the output of this controlling second exclusive-OR gate EXORA2 is also tied to a carry input of the adder ADDER1. This connection completes the negation function wherein a complement of the input would occur without it.

A contribution of the inner pair of filter coefficients h[1], h[2] to the output of the interpolation and selection stage 600 may be designated as an inner pair contribution IPCh1$h$2. Table 3 below further defines the coefficients h[1], h[2].

TABLE 3

| $0 \leq$ rxSamplePhase < 0.5 | $0.5 \leq$ rxSamplePhase < 1.0 |
|---|---|
| h[1] = 9/8 * rxSamplePhase | h[1] = 1.0 + 7/8 * (rxSamplePhase − 1.0) |
| h[2] = 1.0 − 7/8 * rxSamplePhase | h[2] = −9/8 * (rxSamplePhase − 1.0) |

Then,

*IPCh*1*h*2=h[1]*0*D*2+h[2]*OD1.

If (0<rxSamplePhase<0.5), then

*IPCh*1*h*2=0*D*1+1/8rxSamplePhase
(9*0*D*2−7*OD1), else, if (0.5<rxSamplePhase<1.0), then IPCh1*h*2=0*D*2+1/8*(rxSamplePhase-1.0)*
(7*0*D*2−9*0*D*1)

First and second cases may be considered. Consider the first case, where OD2!=OD1. If ($0 \leq$ rxSamplePhase<0.5), then

*IPCh*1*h*2=*OD*1−2*rxSamplePhase*OD1, else, if ($0.5 \leq$ rxSamplePhase<1.0), then

*IPCh*1*h*2=*OD*2−2*(*rxSamplePhase*-1.0)*0*D*1,

*IPCh*1*h*2=−*OD*1−2*rxSamplePhase*0*D*1+2*0*D*1,

*IPCh*1*h*2=0*D*1−2rxSamplePhase0*D*1.

Therefore, in this first case, the inner pair contribution IPCh1$h$2 is independent of the range of the sample phase rxSamplePhase.

Next, consider the second case, where OD2==OD1. If (0<rxSamplePhase<0.5), then

*IPCh*1*h*2=0*D*1+1/4rxSamplePhaseOD*1, else, if ($0.5 \leq$ rxSamplePhase<1.0), then IPCh1h2=ODl-1/4*(rxSamplePhase-1)*OD1.

Notice that the inner pair contribution IPCh1$h$2 may be split into first and second inner pair contributions 1IPCh1$h$2, 2IPCh1$h$2 to the sum as follows. The first inner pair contribution 1IPCh1$h$2 may be expressed as:

1*IPCh*1*h*2=*OD*1.

The second inner pair contribution 2IPChlh2 may be expressed as: if (OD2!=OD1), then 2*IPCh*1*h*2=−2*rxSamplePhase**0*D*1, else, if ($0 \leq$ rxSamplePhase<0.5), then 2*IPCh*1*h*2=1/4*rxSamplePhase**0*D*1, else, if (0.5<rxSamplePhase<1.0), then 2*IPCh*1*h*2=1/4*(*rxSamplePhase*-1.0)**OD*1.

The first inner pair contribution 1IPCh1$h$2 can be seen in FIG. 6 as the middle adder input INPUTM to the adder ADDER1. Recall that the delay signal designated as OD1 has a value of zero for an input signal value of −1.0 and a value of one for an input signal value of +1.0. The middle multiplexor MUXM selects either −1.0 or +1.0 according to exactly this encoding. The second inner pair contribution 2IPCh1$h$2 is provided to the lower input INPUTL of the adder ADDER1. The output of fourth exclusive-OR gate EXORB1, whose inputs are the delay signals designated as OD2, OD1 has a value of one when (OD2!=OD1).

The output of the lower multiplexor MUXL may have values of either (8*rxSamplePhase), rxSamplePhase or (rxSamplePhase−1.0). It has a value of (8*rxSamplePhase) when the output of the fourth exclusive-OR gate EXORB1 is asserted. Otherwise, it has a value of the sample phase rxSamplePhase when (0<rxSamplePhase<0.5), or a value of (rxSamplePhase−1.0) when (0.5<rxSamplePhase<1.0). The output of the lower multiplexor MUXL is conditionally complemented by the fifth exclusive-OR gate EXORB2 connected directly to the lower adder input INPUTL.

The controlling input to this complementing fifth exclusive-OR gate EXORB2 is the output of the exclusive-NOR gate EXNOR1 whose inputs are the delay signal designated as OD1 and the output of the logical-OR gate LORI. The logical-OR gate LOR1 has two inputs, which are the sample phase rxSamplePhase[bit 15] and the output of the fourth exclusive-OR gate EXORB1. The output of the fourth exclusive-OR gate EXORB1 has a value of one when (OD2!=OD1). The sample phase rxSamplePhase[bit 15] has a value of zero when ($0 \leq$ rxSamplePhase<0.5) and a value of one when (0.5<rxSamplePhase<1.0). Thus, the output of the logical-OR gate LOR1 has a value of one when either ($0.5 \leq$ rxSamplePhase<1.0) or (OD2!=OD1).

The lower adder input INPUTL is negated when (0.5<rxSamplePhase<1.0) or (OD2!=OD1), and when the delay signal designated as OD1 is +1.0 or when (0<rxSamplePhase<0.5) and the delay signal designated as OD2==OD1 and the delay signal designated as OD1 is −1.0. This corresponds exactly to the negation of the second inner pair contribution 2IPCh1$h$2 (+/−1/4 and −2). Note that the output of the fifth exclusive-OR gate EXORB2 is also tied to a carry input of the adder ADDER1. This connection completes the negation function whereas without it only a complement of the lower input INPUTL would exist.

With regard to scaling, the outer pair contribution OPCh0$h$3 is either zero or one fourth of the sample phase rxSamplePhase. Similarly, the second inner pair contribution 2IPCh1$h$2 is either two or one fourth the sample phase rxSamplePhase. To achieve the proper relative scaling, the sample phase rxSamplePhase is shifted left three bits when a scale factor of two is chosen (compared to a scale factor of 1/4 being chosen). The correct absolute scaling is achieved by proper bit alignment into the adder ADDER1. To observe this, note that in FIG. 6, the upper input INPUTU to the adder ADDER1 is on bits [16:0]. This upper input INPUTU is sign extended in the adder ADDER1 to [19:0] by copying bit 16 onto bit positions 17, 18 and 19.

The middle input INPUTM, whose value is either -1.0 or +1.0, is represented by the following bit patterns to the adder ADDER1:

$$-1.0 \rightarrow 11.0000\_0000\_0000\_0000\_00$$
$$+1.0 \rightarrow 01.0000\_0000\_0000\_0000\_00$$

The lower input INPUTL to the adder ADDER1 is already presented at full width, [19:0].

It should be understood that the above described and illustrated embodiments of the resampler, its component parts and environment for employing the resampler are submitted for illustrative purposes only and other configurations compatible with the principles of the present invention may be employed as the application dictates. For a better understanding of digital communications, in general, and digital subscriber line services including the standards and systems that support the technology, see IEEE Signal Processing Magazine, January 1996, vol. 13, no. 1, pg. 41), "Understanding Digital Subscriber Line Technology" by Thomas Starr, Peter Silverman, and John M. Coiffi, Prentice Hall (1998), and "Digital Communication" by Edward A. Lee and David G. Messerschmitt, Kluwer Academic Publishers (1994), which are incorporated herein by reference.

Although the present invention has been described in detail, those skilled in the art should understand that they can make various changes, substitutions and alterations herein without departing from the spirit and scope of the invention in its broadest form.

What is claimed is:

1. A merged interpolator configured to receive a one-bit input signal, comprising:
    a multiple order interpolation filter, configured to generate a sample range from at least three input samples derived from said one-bit input signal; and
    a linear interpolation filter, merged with said multiple order interpolation filter, configured to develop a plurality of samples within said sample range.

2. The interpolator as recited in claim 1 wherein said multiple order interpolation filter is configured to generate said sample range from four input samples associated with said one-bit input signal.

3. The interpolator as recited in claim 1 wherein said sample range is a subset of a range associated with said input samples.

4. The interpolator as recited in claim 1 wherein said multiple order interpolation filter is a finite impulse response filter.

5. The interpolator as recited in claim 1 wherein said linear interpolation filter is configured to generate 512 samples.

6. A method of interpolating a one-bit input signal, comprising:
    generating a sample range from at least three input samples associated with said one-bit input signal employing a multiple order interpolation filter; and
    developing a plurality of samples within said sample range employing a linear interpolation filter.

7. The method as recited in claim 6 wherein said generating comprises generating said sample range from four input samples associated with said one-bit input signal.

8. The method as recited in claim 6 wherein said sample range is a subset of a range associated with said input samples.

9. The method as recited in claim 6 wherein said multiple order interpolation filter is a finite impulse response filter.

10. A resampler for use with a bit pump having a receive path couplable to an oscillator, comprising:
    an interpolation stage, coupled to an input of said resampler, configured to receive a one-bit input signal representing at least a portion of a receive signal propagating along said receive path and including:
        a multiple order interpolation filter, configured to generate an intermediate sample range from at least three input samples associated with said one-bit input signal, and
        a linear interpolation filter, associated with said multiple order interpolation filter, configured to develop a plurality of intermediate samples within said intermediate sample range; and
    a selection stage, coupled to said interpolation stage, configured to select one of said plurality of intermediate samples thereby providing an output sample that corresponds to a phase of said oscillator.

11. The resampler as recited in claim 10 wherein said interpolation stage is configured to receive multiple one-bit input signals representing at least a portion of said receive signal and said interpolation stage further comprises a plurality of linear interpolation filters configured to develop a plurality of intermediate samples from at least two input samples associated with ones of said multiple one-bit input signals.

12. The resampler as recited in claim 11 wherein said selection stage is configured to select corresponding ones of said plurality of intermediate samples from said at least two input samples associated with ones of said multiple one-bit input signals thereby providing output samples that correspond to said phase of said oscillator.

13. The resampler as recited in claim 12 further comprising a combining stage configured to combine said output samples.

14. The resampler as recited in claim 10 further comprising a filter stage configured to filter said output sample.

15. The resampler as recited in claim 14 wherein said filter stage comprises one of a second and third order section.

16. The resampler as recited in claim 10 further comprising a delay stage.

17. The resampler as recited in claim 10 wherein said multiple order interpolation filter is configured to generate said intermediate sample range from four input samples associated with said one-bit input signal.

18. The resampler as recited in claim 10 wherein said intermediate sample range is a subset of a range associated with said input samples.

19. The resampler as recited in claim 10 wherein said multiple order interpolation filter is a finite impulse response filter.

20. A method of resampling at least a portion of a receive signal propagating along a receive path couplable to an oscillator of a bit pump, comprising:
    receiving a one-bit input signal representing at least a portion of said receive signal;

generating an intermediate sample range from at least three input samples associated with said one-bit input signal;

developing a plurality of intermediate samples within said intermediate sample range; and selecting one of said plurality of intermediate samples thereby providing an output sample that corresponds to a phase of said oscillator.

21. The method as recited in claim 20 further comprising receiving multiple one-bit input signals representing at least a portion of said receive signal and developing a plurality of intermediate samples from at least two input samples associated with ones of said multiple one-bit input signals.

22. The method as recited in claim 21 further comprising selecting corresponding ones of said plurality of intermediate samples from said at least two input samples associated with ones of said multiple one-bit input signals thereby providing output samples that correspond to said phase of said oscillator.

23. The method as recited in claim 22 further comprising combining said output samples.

24. The method as recited in claim 20 further comprising filtering said output sample.

25. The method as recited in claim 24 wherein said filtering is performed by a filter stage having one of a second and third order section.

26. The method as recited in claim 21 further comprising delaying ones of said multiple one-bit input signals.

27. The method as recited in claim 20 wherein said generating said intermediate sample range is from four input samples associated with said one-bit input signal.

28. The method as recited in claim 20 wherein said intermediate sample range is a subset of a range associated with said input samples.

29. The method as recited in claim 20 wherein said generating is performed by a multiple order finite impulse response interpolation filter.

30. A bit pump having a transmit and receive path, comprising:
a precoder, coupled to said transmit path, that preconditions a transmit signal propagating along said transmit path;
a modulator, coupled to said precoder, that reduces a noise associated with said transmit signal;
an analog-to-digital converter, coupled to said receive path, that converts a receive signal received at said bit pump into a digital format;
a resampler, coupled to said analog-to-digital converter and an oscillator of said bit pump, including:
an interpolation-stage, coupled to an input of said resampler, that receives a one-bit input signal representing at least a portion of said receive signal, including:
a multiple order interpolation filter that generates an intermediate sample range from at least three input samples associated with said one-bit input signal, and
a linear interpolation filter, associated with said multiple order interpolation filter, that develops a plurality of intermediate samples within said intermediate sample range, and
a selection stage, coupled to said interpolation stage, that selects one of said plurality of intermediate samples thereby providing an output sample that corresponds to a phase of said oscillator; and an echo canceling system, coupled between said transmit and receive path, that attenuates an echo in said receive signal.

31. The bit pump as recited in claim 30 wherein said interpolation stage receives multiple one-bit input signals representing at least a portion of said receive signal and said interpolation stage further comprises a plurality of linear interpolation filters that develop a plurality of intermediate samples from at least two input samples associated with ones of said multiple one-bit input signals.

32. The bit pump as recited in claim 31 wherein said selection stage selects corresponding ones of said plurality of intermediate samples from said at least two input samples associated with ones of said multiple one-bit input signals thereby providing output samples that correspond to said phase of said oscillator.

33. The bit pump as recited in claim 32 wherein said resampler further comprises a combining stage that combines said output samples.

34. The bit pump as recited in claim 30 wherein said resampler further comprises a filter stage that filters said output sample.

35. The bit pump as recited in claim 34 wherein said filter stage comprises one of a second and third order section.

36. The bit pump as recited in claim 30 wherein said resampler further comprises a delay stage.

37. The bit pump as recited in claim 30 wherein said multiple order interpolation filter generates said intermediate sample range from four input samples associated with said one-bit input signal.

38. The bit pump as recited in claim 30 wherein said intermediate sample range is a subset of a range associated with said input samples.

39. The bit pump as recited in claim 30 wherein said multiple order interpolation filter is a finite impulse response filter.

40. A transceiver, comprising:
a framer that formats signals within said transceiver;
a bit pump coupled to said framer and having a transmit and receive path, including:
a precoder, coupled to said transmit path, that preconditions a transmit signal propagating along said transmit path;
a modulator, coupled to said precoder, that reduces a noise associated with said transmit signal;
an analog-to-digital converter, coupled to said receive path, that converts a receive signal received at said bit pump into a digital format;
a resampler, coupled to said analog-to-digital converter and an oscillator of said bit pump, including:
an interpolation stage, coupled to an input of said resampler, that receives a one-bit input signal representing at least a portion of said receive signal, including:
a multiple order interpolation filter that generates an intermediate sample range from at least three input samples associated with said one-bit input signal, and
a linear interpolation filter, associated with said multiple order interpolation filter, that develops a plurality of intermediate samples within said intermediate sample range, and
a selection stage, coupled to said interpolation stage, that selects one of said plurality of intermediate samples thereby providing in output sample that corresponds to a phase of said oscillator; and an echo canceling system, coupled between said transmit and receive path, that attenuates an echo in said receive signal; and a controller that controls an operation of said framer and said bit pump.

41. The transceiver as recited in claim 40 wherein said interpolation stage receives multiple one-bit input signals representing at least a portion of said receive signal and said interpolation stage further comprises a plurality of linear interpolation filters that develop a plurality of intermediate samples from at least two input samples associated with ones of said multiple one-bit input signals.

42. The transceiver as recited in claim 41 wherein said selection stage selects corresponding ones of said plurality of intermediate samples from said at least two input samples associated with ones of said multiple one-bit input signals thereby providing output samples that correspond to said phase of said oscillator.

43. The transceiver as recited in claim 42 wherein said resampler further comprises a combining stage that combines said output samples.

44. The transceiver as recited in claim 40 wherein said resampler further comprises a filter stage that filters said output sample.

45. The transceiver as recited in claim 44 wherein said filter stage comprises one of a second and third order section.

46. The transceiver as recited in claim 40 wherein said resampler further comprises a delay stage.

47. The transceiver as recited in claim 40 wherein said multiple order interpolation filter generates said intermediate sample range from four input samples associated with said one-bit input signal.

48. The transceiver as recited in claim 40 wherein said intermediate sample range is a subset of a range associated with said input samples.

49. The transceiver as recited in claim 40 wherein said multiple order interpolation filter is a finite impulse response filter.

* * * * *